(12) United States Patent
Kang et al.

(10) Patent No.: US 8,421,466 B2
(45) Date of Patent: Apr. 16, 2013

(54) APPARATUS AND METHOD FOR SENSING LEAKAGE CURRENT OF BATTERY

(75) Inventors: Ju-Hyun Kang, Daejeon (KR); Jee-Ho Kim, Daejeon (KR); Sang-Hoon Lee, Daejeon (KR); Dong-Keun Kwon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 430 days.

(21) Appl. No.: 12/792,253

(22) Filed: Jun. 2, 2010

(65) Prior Publication Data

US 2010/0237872 A1    Sep. 23, 2010

Related U.S. Application Data

(63) Continuation-in-part of application No. PCT/KR2009/004927, filed on Sep. 1, 2009.

(30) Foreign Application Priority Data

Sep. 1, 2008   (KR) .................. 10-2008-0085756
Sep. 1, 2009   (KR) .................. 10-2009-0082231

(51) Int. Cl.
   *G01N 27/416*   (2006.01)
(52) U.S. Cl.
   USPC ........................................... 324/429
(58) Field of Classification Search .............. None
   See application file for complete search history.

(56) References Cited

U.S. PATENT DOCUMENTS 5,485,090 A * 1/1996 Stephens ................. 324/433
7,663,375 B2 * 2/2010 Yonezawa ................ 324/434

FOREIGN PATENT DOCUMENTS

| JP | 7-203601 A | | 8/1995 |
| JP | 2004-6190 A | | 1/2004 |
| JP | 2007-198877 A | | 8/2007 |
| JP | 2009063511 A | * | 3/2009 |

* cited by examiner

*Primary Examiner* — Paresh Patel
(74) *Attorney, Agent, or Firm* — Birch, Stewart, Kolasch & Birch, LLP

(57) ABSTRACT

An apparatus for sensing a leakage current of a battery comprises a floating capacitor charged with voltage detected from a cathode or anode terminal of a battery, a cathode terminal selection switching unit for selecting a voltage detection path for the cathode terminal and charging the floating capacitor with a detection voltage of the cathode terminal, an anode terminal selection switching unit for selecting a voltage detection path for the anode terminal and charging the floating capacitor with a detection voltage of the anode terminal, a DC voltage applying unit for applying DC voltage through the voltage detection path for the anode terminal, a voltage measuring unit for measuring the charged detection voltage of the cathode or anode terminal, and a leakage current determining unit for determining the occurrence of leakage current based on the measured detection voltages of the cathode and anode terminals.

31 Claims, 5 Drawing Sheets

APPARATUS AND METHOD FOR SENSING LEAKAGE CURRENT OF BATTERY

CROSS-REFERENCE TO RELATED APPLICATION

This application is a continuation-in-part of International Application No. PCT/KR2009/004927 filed Sep. 1, 2009, which claims priority under 35 USC 119(a) to Korean Patent Application No. 10-2008-0085756 filed on Sep. 1, 2008, and No. 10-2009-0082231 filed on Sep. 1, 2009, in Republic of Korea, the entire contents of which are incorporated herein by reference.

TECHNICAL FIELD

The present invention relates to apparatus and method for sensing a leakage current of a battery, and more particularly to apparatus and method for sensing a leakage current of a battery adopted in a battery power supply system demanding high voltage such as electric vehicles and hybrid vehicles.

BACKGROUND ART

In recent, along with exhaustion of fossil fuels and environmental contamination, more interests are taken in electric vehicles or hybrid vehicles (hereinafter, generally called electric vehicles), which may be driven by means of batteries without using fossil fuels.

Batteries used for electric vehicles are mostly secondary batteries. Secondary batteries are classified into lithium series batteries and nickel-hydrogen series batteries. Lithium series batteries are mainly applied to small-sized products such as digital cameras, P-DVD, MP3P, cellular phones, PDA, portable game devices, power tools and E-bikes, and nickel-hydrogen series are mainly applied to products demanding high power such as vehicles.

Any device using a battery needs to keep insulation between the battery and the device in a good state. Bad insulation of the battery causes a leakage current, which results in various problems. For reference, a leakage current of a battery causes unexpected discharge of the battery or malfunctions of electronic equipment included in the device. Also, a leakage current of a battery employed in an apparatus using a high voltage battery such as electric vehicles may give a fatal electric shock to a person. Accordingly, in the related art, it is demanded to develop a scheme for accurately and thoroughly detecting a leakage current of a battery.

DISCLOSURE

Technical Problem

The present invention is designed to solve the above problems, and therefore the present invention is directed to providing apparatus and method for sensing a leakage current of a battery, which may sense a leakage current of a battery using a simple leakage current sensing circuit configuration in an easy and accurate way.

Technical Solution

The present invention may provide an apparatus for sensing a leakage current of a battery, which comprises a floating capacitor charged with a voltage detected from a cathode terminal or an anode terminal of a battery; a cathode terminal selection switching unit for selecting voltage detection path for the cathode terminal and charging the floating capacitor with a detection voltage of the cathode terminal; an anode terminal selection switching unit for selecting a voltage detection path for the anode terminal and charging the floating capacitor with a detection voltage of the anode terminal; a DC (Direct Current) voltage applying unit for applying a DC voltage through the selected voltage detection path for the anode terminal; a voltage measuring unit for measuring the detection voltage of the cathode terminal or the anode terminal, charged to the floating capacitor; and a leakage current determining unit for determining the occurrence of a leakage current based on the detection voltages of the cathode terminal and the anode terminal, measured by the voltage measuring unit.

The apparatus for sensing a leakage current of a battery according to the present invention may further comprise a first line connecting the cathode terminal and the anode terminal of the battery; a first voltage distribution node located on the first line; and a second line diverged from the first voltage distribution node.

According to the present invention, the cathode terminal selection switching unit may comprise a first switch installed between the first voltage distribution node and the cathode terminal of the battery; and a second switch installed on the second line.

Preferably, when the voltage detection path for the cathode terminal is selected, the first and second switches are turned on at the same time under the control of the leakage current determining unit.

According to the present invention, the anode terminal selection switching unit may comprise a third switch installed between the first voltage distribution node and the anode terminal of the battery; and a fourth switch installed on a third line diverged from the second line.

Preferably, when the voltage detection path for the anode terminal is selected, the third and fourth switches are turned on at the same time under the control of the leakage current determining unit.

According to the present invention, a second voltage distribution node may be located on the second line, and the floating capacitor may be installed between the second voltage distribution node and the ground. Also, the DC voltage applying unit may be installed between the anode terminal selection switching unit and the ground.

In the present invention, the voltage measuring unit may be a voltage follower that outputs an analog voltage signal corresponding to a voltage level charged to the floating capacitor.

In another aspect of the present invention, the apparatus for sensing a leakage current of a battery may further comprise a relay capacitor charged with the detection voltage of the cathode terminal or the anode terminal, charged to the floating capacitor; a charge switching unit for applying the voltage charged to the floating capacitor to the relay capacitor for relay charging; and a voltage apply switching unit for applying the detection voltage of the cathode terminal or the anode terminal, charged to the relay capacitor, to the voltage measuring unit.

Preferably, the charge switching unit may be turned off before the voltage apply switching unit turns on under the control of the leakage current determining unit.

In another aspect of the present invention, the voltage measuring unit may be a differential amplifier that outputs an analog voltage signal corresponding to a difference of voltages at both terminals of the relay capacitor.

In the present invention, the leakage current determining unit may comprise a switch controller for controlling operations of the cathode terminal selection switching unit and the anode terminal selection switching unit; an A/D (Analog/Digital) converter for converting an analog voltage signal corresponding to the detection voltages of the cathode terminal and the anode terminal, output from the voltage measuring unit, into a digital voltage signal; and a CPU (Central Processing Unit) for receiving the digital voltage signal from the A/D converter and determining the occurrence of a leakage current based on the detection voltages of the cathode terminal and the anode terminal.

In one aspect of the present invention, the leakage current determining unit may calculate a leakage resistance according to the following equation, and determine that a leakage current occurs in case the calculated leakage resistance is smaller than a criterion insulation resistance:

$$R_{leakage} = R_i \times \frac{(E - V_A + V_B)}{(V_A - V_B)}$$

where $R_i$ is an internal resistance of the apparatus, E is a voltage of both ends of the battery, $V_A$ is the detection voltage of the cathode terminal charged to the floating capacitor, and $V_B$ is the detection voltage of the anode terminal charged to the floating capacitor.

In another aspect of the present invention, the leakage current determining unit may determine that a leakage current occurs in case the measured detection voltage of the cathode terminal or the anode terminal departs from a preset safe voltage range.

In still another aspect of the present invention, the leakage current determining unit may obtain a leakage resistance corresponding to the detection voltages of the cathode terminal and the anode terminal with reference to a look-up table in which leakage resistances are already defined for each detection voltage of the cathode terminal and the anode terminal under various conditions, and then determines that a leakage current occurs in case the obtained leakage resistance is smaller than a criterion insulation resistance.

Selectively, the leakage current determining unit further comprises a leakage current alarming unit for visually or audibly alarming the occurrence of a leakage current, and the leakage current alarming unit makes a visual or audible alarm in case a leakage current occurs.

Preferably, the detection voltages of the cathode terminal and the anode terminal, charged to the relay capacitor, may have the same polarity.

The present invention may provide a battery pack or a battery-driven apparatus, which comprises the apparatus for sensing a leakage current of a battery as disclosed above.

The present invention may also provide a method for sensing a leakage current of a battery, which comprises selecting a voltage detection path for a cathode terminal of a battery, charging a floating capacitor with a detection voltage of the cathode terminal of the battery, and then measuring the detection voltage of the cathode terminal; selecting a voltage detection path for an anode terminal of the battery, applying a DC voltage to the anode terminal of the battery to charge the floating capacitor with a detection voltage of the anode terminal of the battery, and then measuring the detection voltage of the anode terminal; and determining from the measured detection voltages of the cathode terminal and the anode terminal whether a leakage current occurs.

In another aspect of the present invention, the present invention may provide a method for sensing a leakage current of a battery, which comprises selecting a voltage detection path for a cathode terminal of a battery, primarily charging a floating capacitor with a detection voltage of the cathode terminal of the battery, and secondarily charging a relay capacitor with the charged detection voltage of the cathode terminal; measuring the detection voltage of the cathode terminal, secondarily charged to the relay capacitor, in a state that the relay capacitor is electrically separated from the battery; selecting a voltage detection path for an anode terminal of the battery, applying a DC voltage to the anode terminal of the battery to primarily charge the floating capacitor with a detection voltage of the anode terminal of the battery, and then secondarily charging a relay capacitor with the charged detection voltage of the anode terminal; measuring the detection voltage of the anode terminal, secondarily charged to the relay capacitor, in a state that the relay capacitor is electrically separated from the battery; and determining from the measured detection voltages of the cathode terminal and the anode terminal whether a leakage current occurs.

DESCRIPTION OF DRAWINGS

The accompanying drawings illustrate the preferred embodiments of the present invention and are included to provide a further understanding of the spirit of the present invention together with the detailed description of the invention, and accordingly, the present invention should not be limitedly interpreted to only the matters shown in the drawings.

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
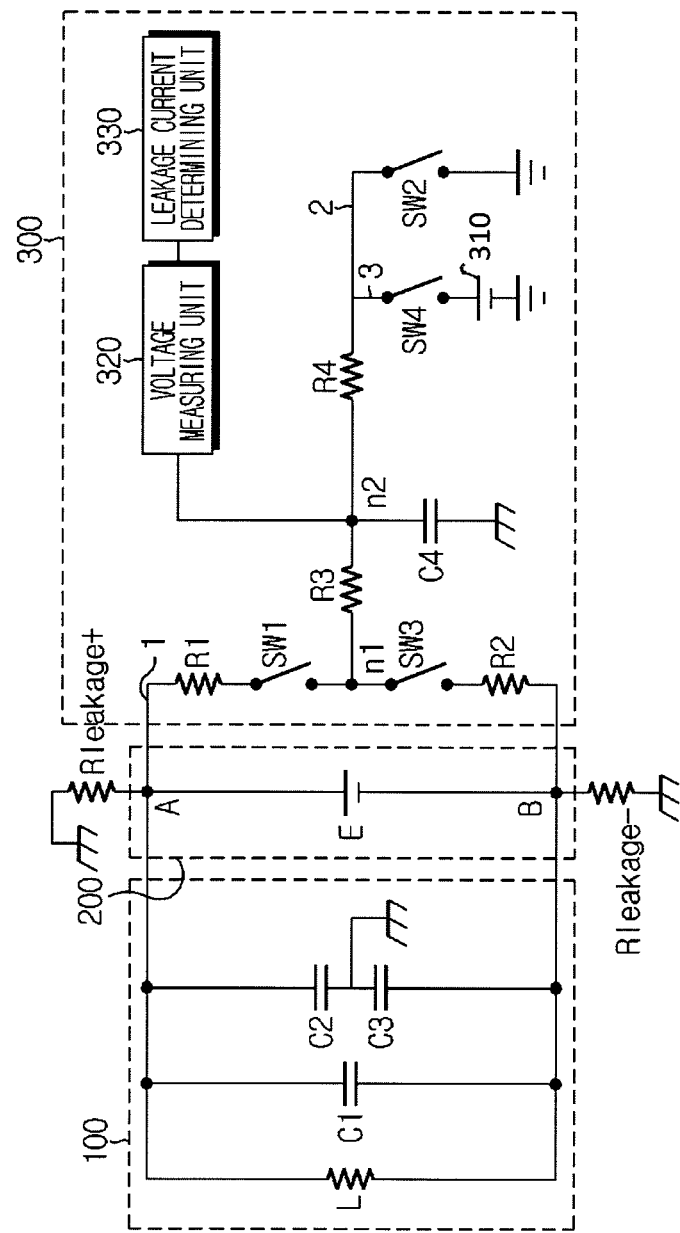
FIG. 1 is a circuit diagram showing an apparatus for sensing a leakage current of a battery according to a first embodiment of the present invention.

FIG. 1 is a circuit diagram showing an apparatus for sensing a leakage current of a battery according to a first embodiment of the present invention.

As shown in FIG. 1, a battery leakage current sensing apparatus 300 according to the present invention is connected to both terminals of a battery 200 having a plurality of cells and supplying power to a load system 100, so as to sense a leakage current of the battery 200.

The load system 100 is a means using the electric energy output from the battery 200, and it may be a system demanding high power such as an electric vehicle or a hybrid vehicle. A load L of the load system 100, which consumes electric energy, may be a driving motor for transferring power to an electric vehicle or a hybrid vehicle, a DC-to-DC converter for converting a voltage level output from the battery 200, or the like. However, the load system 100 of the present invention and the load L included therein are not limited to the above.

Capacity components C1, C2 and C3 represent an artificial filter component for filtering noise generated at the battery 200 and the load L and a parasitic capacitor component generated when connecting the battery 200 to the load system 100.

The battery 200 is an electric energy storage means, and the battery 200 includes a plurality of unit cells capable of being repeatedly charged and discharged. The unit cells are connected in series or in parallel. The unit cell is an electric double-layer capacitor including an ultra-capacitor, or a secondary battery such as a lithium ion battery, a lithium polymer battery, a nickel cadmium battery, a nickel hydrogen battery and a nickel zinc battery, well known in the art.

The battery leakage current sensing apparatus 300 of the first embodiment includes a floating capacitor C4 charged with a voltage detected from a cathode terminal A or an anode terminal B of a battery 200, a cathode terminal selection switching unit SW1, SW2 for selecting a voltage detection path for the cathode terminal A and charging the floating capacitor C4 with the detection voltage of the cathode terminal A, an anode terminal selection switching unit SW3, SW4 for selecting a voltage detection path for the anode terminal B and charging the floating capacitor C4 with the detection voltage of the anode terminal B; a DC voltage applying unit 310 for applying a DC voltage through the voltage detection path of the selected anode terminal B, a voltage measuring unit 320 for measuring a detection voltage of the cathode or anode terminal A, B of the battery 200 charged to the floating capacitor C4, and a leakage current determining unit 330 for calculating a leakage resistance by using the detection voltage of the cathode and anode terminals A, B measured at the voltage measuring unit 320 and comparing the leakage resistance with a criterion insulation resistance to determine whether a leakage current occurs or not.

A first line 1 is installed between the cathode terminal A and the anode terminal B of the battery 200. Also, a second line 2 is diverged from a first voltage distribution node n1 on the first line 1. The second line 2 is connected to the ground, and a second voltage distribution node n2 is located on the second line 2. A third line 3 is diverged from the second voltage distribution node n2 and connected to the ground.

The cathode terminal selection switching unit SW1, SW2 includes a first switch SW1 installed between the first voltage distribution node n1 and the cathode terminal A of the battery 200, and a second switch SW2 installed on the second line 2. A first resistor R1 is installed between the first switch SW1 and the cathode terminal A.

The anode terminal selection switching unit SW3, SW4 includes a third switch SW3 installed between the first voltage distribution node n1 and the anode terminal B of the battery 200, and a fourth switch SW4 installed on the third line 3 diverged from the second line 2. A second resistor R2 is installed between the third switch SW3 and the anode terminal B.

The voltage detection path for the cathode terminal A is selected when the cathode terminal selection switching unit SW1, SW2 turns on. If the voltage detection path for the cathode terminal A is selected, the floating capacitor C4 is charged with the detection voltage of the cathode terminal A as an electric current flows from the cathode terminal A of the battery 200 to the second voltage distribution node n2.

On the contrary, the voltage detection path for the anode terminal B is selected when the anode terminal selection switching unit SW3, SW4 turns on. If the voltage detection path for the anode terminal B is selected, a positive DC voltage is applied to the second voltage distribution node n2 by means of the DC voltage applying unit 310. Thus, as an electric current flows from the DC voltage applying unit 310 to the anode terminal B of the battery 200, the floating capacitor C4 is charged with a detection voltage of the anode terminal B.

Preferably, the cathode terminal selection switching unit SW1, SW2 and the anode terminal selection switching unit SW3, SW4 turn on in accordance with the control of the leakage current determining unit 330.

A third resistor R3 is installed between the second voltage distribution node n2 and the first voltage distribution node n1. The third resistor R3 controls a magnitude of noise current introduced from the battery 200 or the load L. A fourth resistor R4 represents a resistor component in the part of the second line 2 from the second voltage distribution node n2 to the ground.

The floating capacitor C4 is installed between the second voltage distribution node n2 and the ground. The floating capacitor C4 is charged with the detection voltage of the cathode terminal A or the anode terminal B of the battery 200 according to turning-on of the cathode terminal selection switching unit SW1, SW2 or the anode terminal selection switching unit SW3, SW4.

The detection voltages of the cathode terminal A and the anode terminal B charged to the floating capacitor C4 have the same polarity. It is because, when the floating capacitor C4 is charged with the detection voltage of the cathode terminal A, the voltage of the cathode terminal A of the battery 200 is applied to the second voltage distribution node n2 through the first resistor R1 and the third resistor R3, and when the floating capacitor C4 is charged with the detection voltage of the anode terminal B, a positive DC voltage is applied to the second voltage distribution node n2 by means of the DC voltage applying unit 310. As mentioned above, if the detection voltage of the cathode terminal A charged to the floating capacitor C4 have the same polarity as the detection voltage of the anode terminal B charged to the floating capacitor C4, the voltage measuring unit 320 may be realized with a simple circuit configuration without using a polarity reverse circuit.

The DC voltage applying unit 310 is installed between the fourth switch SW4 and the ground, and the DC voltage applying unit 310 applies a positive DC voltage to the second voltage distribution node n2 through the fourth resistor R4 if the anode terminal selection switching unit SW3, SW4 turns on. Then, as an electric current flows from the DC voltage applying unit 310 toward the anode terminal B of the battery 200, the floating capacitor C4 is charged with the detection voltage of the anode terminal B.

The voltage measuring unit 320 measures the detection voltage of the cathode terminal A and the detection voltage of the anode terminal B charged to the floating capacitor C4 and then outputs an analog voltage signal to the leakage current determining unit 330. Preferably, the voltage measuring unit 320 may be a voltage follower that outputs an analog voltage signal with a voltage level charged to the floating capacitor C4, but the present invention is not limited thereto.

The leakage current determining unit 330 determines whether a leakage current occurs by using the detection voltage of the cathode terminal A and the detection voltage of the anode terminal B input from the voltage measuring unit 320.

For example, the leakage current determining unit 330 may calculate a leakage resistance from the detection voltage of the cathode terminal A and the detection voltage of the anode terminal B in accordance with an equation, explained later, and then determine that a leakage current occurs if the calculated leakage resistance is smaller than a criterion insulation resistance.

As another example, the leakage current determining unit 330 may determine that a leakage current occurs if magnitudes of the detection voltage of the cathode terminal A or the detection voltage of the anode terminal B are out of a safe voltage range.

The safe voltage range may be set experimentally. In other words, first, a variable resistor is connected to a cathode terminal A and an anode terminal B of a standard battery having the same specification as the battery 200. Also, an expected leakage resistance range of the battery 200 is set sufficiently widely. After that, leakage resistance values are sampled at regular intervals in the set leakage resistance range. Then, as a resistance of the variable resistor connected to the cathode terminal A and the anode terminal B is changed such that each sampled leakage resistance may occur, detection voltages of the cathode terminal A and the anode terminal B are measured. If the detection voltages of the cathode terminal A and the anode terminal B are measured with respect to each sampled leakage resistance, a detection voltage range of the cathode terminal A and the anode terminal B corresponding to a leakage resistance greater than the criterion insulation resistance is identified. And then, the identified detection voltage range of the cathode terminal A and the anode terminal B is set as a safe voltage range.

As another example, the leakage current determining unit 330 may obtain leakage resistances corresponding to the detection voltage of the cathode terminal A and the detection voltage of the anode terminal B with reference to a look-up table in which leakage resistances are already defined for each detection voltage of the cathode terminal A and each detection voltage of the anode terminal B under various conditions, and then determine that a leakage current occurs if the obtained leakage resistance is smaller than the criterion insulation resistance.

The look-up table may be obtained experimentally. In other words, a variable resistor is connected to a cathode terminal A and an anode terminal B of a standard battery having the same specification as the battery 200. Also, leakage resistance range of the battery 200 of which a look-up table is to be made is set sufficiently widely. After that, leakage resistance values are sampled at regular intervals in the set leakage resistance range. Then, as a resistance of the variable resistor connected to the cathode terminal A and the anode terminal B is changed intentionally such that each sampled leakage resistance may occur, detection voltages of the cathode terminal A and the anode terminal B are measured. Then, detection voltages of the cathode terminal A and the anode terminal B may be obtained in correspondence with each sampled leakage resistance. If detection voltages of the cathode terminal A and the anode terminal B are obtained with respect to leakage resistances under various conditions, it is possible to make a look-up table in which correlations between leakage resistances and detection voltages of the cathode terminal A and the anode terminal B are defined.

A positive leakage resistance Rleakage+ and a negative leakage resistance Rleakage− depicted at both terminals of the battery 200 respectively represent a status when a leakage current occurs, and they equivalently express a virtual resistance value appearing when a leakage current occurs.

Figure 2:
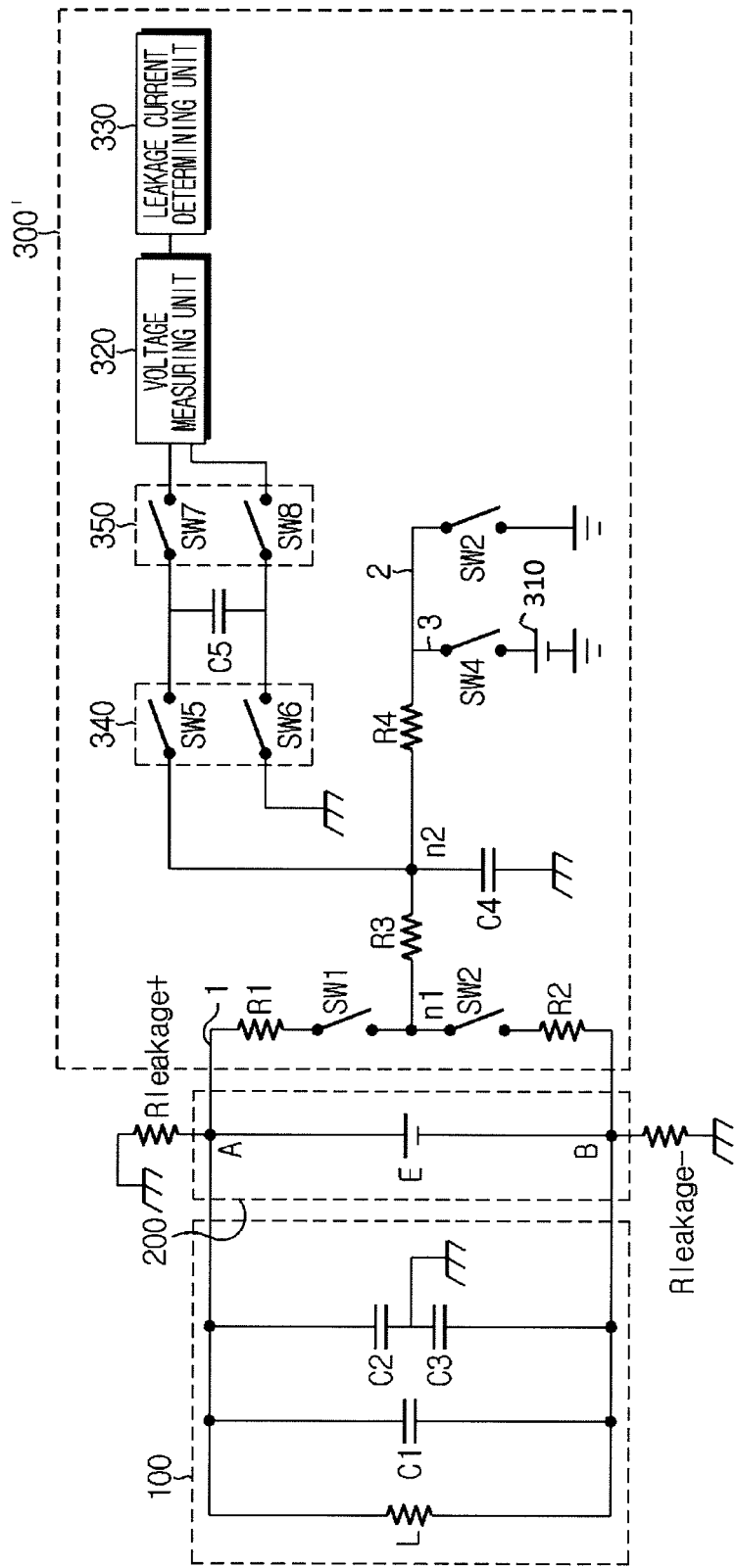
FIG. 2 is a circuit diagram showing an apparatus for sensing a leakage current of a battery according to a second embodiment of the present invention.

FIG. 2 is a circuit diagram showing an apparatus 300' for sensing a leakage current of a battery according to a second embodiment of the present invention.

As shown in FIG. 2, the battery leakage current sensing apparatus 300' of the second embodiment is substantially identical to the battery leakage current sensing apparatus 300 of the first embodiment, except that a charge switching unit 340, a voltage apply switching unit 350 and a relay capacitor C5 are further comprised.

The charge switching unit 340 includes a fifth switch SW5 and a sixth switch SW6. The charge switching unit 340 turns on under the control of the leakage current determining unit 330 to recharge a detection voltage of the cathode terminal A or a detection voltage of the anode terminal B, charged to the floating capacitor C4, to the relay capacitor C5.

The voltage apply switching unit 350 includes a seventh switch SW7 and an eighth switch SW8. The voltage apply switching unit 350 turns on under the control of the leakage current determining unit 330 to apply the detection voltage of the cathode terminal A or the detection voltage of the anode terminal B, charged to the relay capacitor C5, to the voltage measuring unit 320.

Preferably, the charge switching unit 340 turns off under the control of the leakage current determining unit 330 before the voltage apply switching unit 350 turns on. Then, the noise introduced from the battery 200 or the load L to the voltage measuring unit 320 while the voltage measuring unit 320 measures the detection voltage of the cathode terminal A or the anode terminal B charged to the relay capacitor C5 may be effectively blocked.

If the voltage apply switching unit 350 turns on, the voltage measuring unit 320, generates an analog voltage signal corresponding to the detection voltage of the cathode terminal A or the anode terminal B charged to the relay capacitor C5 and outputs the analog voltage signal to the leakage current determining unit 330.

Preferably, the voltage measuring unit 320 may be a differential amplifier that outputs a charged voltage applied to both terminals of the relay capacitor C5, but the present invention is not limited thereto.

The leakage current determining unit 330 determines whether a leakage current occurs by using the detection voltage of the cathode terminal A and the detection voltage of the anode terminal B, input from the voltage measuring unit 320, in the same way as in the first embodiment.

Figure 3:
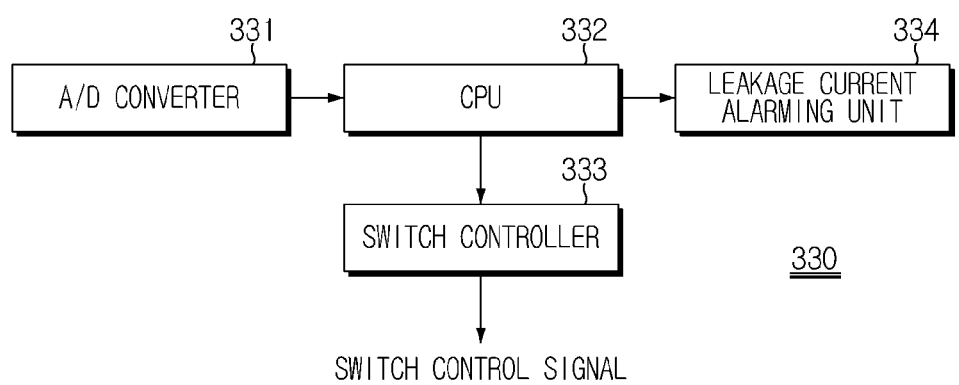
FIG. 3 is a block diagram showing a leakage current determining unit according to a preferred embodiment of the present invention.

FIG. 3 is a block diagram showing a leakage current determining unit 330 according to a preferred embodiment of the present invention.

Referring to FIG. 3, the leakage current determining unit 330 comprises an A/D converter 331, a central processing unit (CPU) 332, a switch controller 333 and a leakage current alarming unit 334.

The A/D converter 331 converts the analog voltage signal output from the voltage measuring unit 320 into a digital voltage signal. The digital voltage signal comprises a digital voltage signal corresponding to the detection voltage of the cathode terminal A and a digital voltage signal corresponding to the detection voltage of the anode terminal B.

The CPU 332 receives the digital voltage signal corresponding to the detection voltages of the cathode terminal A and the anode terminal B from the A/D converter 331 and determines whether a leakage current occurs by using the detection voltages of the cathode terminal A and the anode terminal B.

As an example, the CPU 332 classifies the digitalized voltage signals input from the A/D converter 331 into voltages of the cathode terminal A and the anode terminal B, and calculates a leakage resistance of the battery 200 according to the following equation 1 based on the digitalized voltage signals classified for cathode terminal A and the anode terminal B.

$$R_{leakage} = R_i \times \frac{(E - V_A + V_B)}{(V_A - V_B)} \qquad \text{Equation 1}$$

where, $R_i$ is an internal resistance of the leakage current sensing apparatus, E is voltage of both ends of the battery, $V_A$ is a detection voltage of the cathode terminal A, and $V_B$ is a detection voltage of the anode terminal B. In FIG. 1, if R1=R2, Ri=R1+R3+R4.

Also, the CPU 332 compares the leakage resistance calculated by the equation 1 with a preset criterion insulation resistance and determines that a leakage current occurs if the calculated leakage resistance is smaller than the criterion insulation resistance.

As another example, the CPU 332 classifies the digitalized voltage signals input from the A/D converter 331 into voltages of the cathode terminal A and the anode terminal B, and then determines that a leakage current occurs if the detection voltage of the cathode terminal A or the anode terminal B is departed from a preset safe voltage range (explained above).

As still another example, the CPU 332 may classify the digitalized voltage signals input from the A/D converter 331 into voltages of the cathode terminal A and the anode terminal B, then obtain a leakage resistance corresponding to the measured detection voltages of the cathode terminal A and the anode terminal B with reference to the look-up table in which leakage resistances are previously defined for detection voltages of the cathode terminal A and the anode terminal B under various conditions, and then determine that a leakage current occurs if the obtained leakage resistance is smaller than the criterion insulation resistance.

The switch controller 333 controls operations of the cathode terminal selection switching unit SW1, SW2, the anode terminal selection switching unit SW3, SW4, the charge switching unit 340 and the voltage apply switching unit 350.

Hereinafter, the operations of the switch controller 333 will be explained in detail based on the first and second embodiments.

First Embodiment

Referring to FIGS. 1 and 3, the switch controller 333 controls operations of the cathode terminal selection switching unit SW1, SW2 to charge the floating capacitor C4 with the detection voltage of the cathode terminal A of the battery 200. Also, the switch controller 333 controls operations of the anode terminal selection switching unit SW3, SW4 to charge the floating capacitor C4 with the detection voltage of the anode terminal B of the battery 200.

First, in case a detection voltage of the cathode terminal A is measured, the switch controller 333 turns on the cathode terminal selection switching unit SW1, SW2 and turns off the anode terminal selection switching unit SW3, SW4. Then, an electric current flows from the cathode terminal A of the battery 200 to the floating capacitor C4. As a result, the floating capacitor C4 is charged with a voltage corresponding to the detection voltage of the cathode terminal A, and at the same time a voltage corresponding to the charge voltage level is applied to the voltage measuring unit 320. For reference, the voltage of the cathode terminal A of the battery 200 is applied to the second voltage distribution node n2 through the first resistor R1 and the third resistor R3, so the voltage charged to the floating capacitor C4 has a positive value. Then, the voltage measuring unit 320 measures the charge voltage of the floating capacitor C4 to generate an analog voltage signal corresponding to the detection voltage of the cathode terminal A and then outputs the analog voltage signal to the A/D converter 331 of the leakage current determining unit 330. Then, the A/D converter 331 converts the analog voltage signal corresponding to the detection voltage of the cathode terminal A into a digital voltage signal and outputs the digital voltage signal to the CPU 332. Accordingly, the CPU 332 obtains data relating to the detection voltage of the cathode terminal A, which is necessary for calculating a leakage resistance.

Then, in case a detection voltage of the anode terminal B is measured, the switch controller 333 turns on the anode terminal selection switching unit SW3, SW4 and turns off the cathode terminal selection switching unit SW1, SW2. Then an electric current flows from the DC voltage applying unit 310 to the anode terminal B of the battery 200. As a result, the floating capacitor C4 is charged with a voltage corresponding to the detection voltage of the anode terminal B, and at the same time, a voltage corresponding to a charge voltage level is applied to the voltage measuring unit 320. For reference, a positive DC voltage is applied to the second voltage distribution node n2 through the fourth resistor R4 by means of the DC voltage applying unit 310, so the voltage charged to the floating capacitor C4 has a positive voltage value. Then, the voltage measuring unit 320 measures the charge voltage of the floating capacitor C4 to generate an analog voltage signal corresponding to the detection voltage of the anode terminal B and then outputs the analog voltage signal to the A/D converter 331 of the leakage current determining unit 330. Then, the A/D converter 331 converts the analog voltage signal corresponding to the detection voltage of the anode terminal B into a digital voltage signal and outputs the digital voltage signal to the CPU 332. Accordingly, the CPU 332 obtains data relating to the detection voltage of the anode terminal B, which is necessary for calculating a leakage current.

The voltage measuring unit 320 may be realized by using a voltage follower. The floating capacitor C4 is always charged with a positive voltage, so a polarity reverse circuit may be not comprised in the voltage measuring unit 320. In this case, the circuit configuration of the voltage measuring unit 320 may be simplified.

Second Embodiment

Referring to FIGS. 2 and 3, the switch controller 333 controls operations of the cathode terminal selection switching unit SW1, SW2 and the anode terminal selection switching unit SW3, SW4 to primarily charge the floating capacitor C4 with the detection voltage of the cathode terminal A and the detection voltage of the anode terminal B. Also, the switch controller 333 controls operations of the charge switching unit 340 to secondarily charge the relay capacitor C5 with the detection voltage primarily charged to the floating capacitor C4. After that, the switch controller 333 controls operations of the voltage apply switching unit 350 to apply the detection voltage, secondarily charged to the relay capacitor C5, to the voltage measuring unit.

In detail, in case a detection voltage of the cathode terminal A is measured, the switch controller 333 turns on the cathode terminal selection switching unit SW1, SW2 and turns off the anode terminal selection switching unit SW3, SW4 and the voltage apply switching unit 350. Then, an electric current flows from the cathode terminal A of the battery 200 to the floating capacitor C4, so the floating capacitor C4 is charged with a voltage corresponding to the detection voltage of the cathode terminal A. At this time, a voltage of the cathode terminal A of the battery 200 is applied to the second voltage distribution node n2 through the first resistor R1 and the third resistor R3, so the voltage primarily charged to the floating capacitor C4 has a positive value.

After that, the switch controller 333 turns on the charge switching unit 340 and turns off the cathode terminal selection switching unit SW1, SW2 while keeping the anode terminal selection switching unit SW3, SW4 in a turning-off state. Then, the relay capacitor C5 is secondarily charged with the detection voltage of the cathode terminal A charged to the floating capacitor C4. The voltage secondarily charged to the relay capacitor C5 has the same polarity as the voltage primarily charged to the floating capacitor C4. Thus, the voltage secondarily charged to the relay capacitor C5 has a positive value. Since the voltage apply switching unit 350 keeps a turning-off state while the relay capacitor C5 is secondarily charged with the detection voltage of the cathode terminal A, it is possible to prevent the noise flowing from the battery 200 or the load L from being introduced to the leakage current determining unit 330. Subsequently, the switch controller 333 turns off the charge switching unit 340 and turns on the voltage apply switching unit 350 such that the detection voltage of the cathode terminal A secondarily charged to the relay capacitor C5 is applied to the voltage measuring unit 320. Then, the voltage measuring unit 320 generates an analog voltage signal corresponding to the detection voltage of the cathode terminal A and outputs the analog voltage signal to the A/D converter 331 of the leakage current determining unit 330. Then, the A/D converter 331 converts the analog voltage signal corresponding to the detection voltage of the cathode terminal A into a digital voltage signal and outputs the digital voltage signal to the CPU 332. Accordingly, the CPU 332 obtains data relating to the detection voltage of the cathode terminal A, which is necessary for calculating a leakage resistance. When the voltage measuring unit 320 measures the detection voltage of the cathode terminal A, charged to the relay capacitor C5, the charge switching unit 340 is in a turning-off state, so it is possible to prevent a noise from being introduced from the battery 200 or the load L to the leakage current determining unit 330.

Then, in case a detection voltage of the anode terminal B is measured, the switch controller 333 turns on the anode terminal selection switching unit SW3, SW4 and turns off the cathode terminal selection switching unit SW1, SW2, the charge switching unit 340 and the voltage apply switching unit 350. Then, a positive DC voltage is applied to the second voltage distribution node n2 by means of the DC voltage applying unit 310. Accordingly, an electric current flows from the DC voltage applying unit 310 to the anode terminal B of the battery 200, so the floating capacitor C4 is primarily charged with a voltage corresponding to the detection voltage of the anode terminal B. At this time, a positive DC voltage is applied to the second voltage distribution node n2 through the fourth resistor R4 by means of the DC voltage applying unit 310, so the voltage primarily charged to the floating capacitor C4 has a positive value.

After that, the switch controller 333 turns on the charge switching unit 340 and turns off the anode terminal selection switching unit SW3, SW4 while keeping the cathode terminal selection switching unit SW1, SW2 and the voltage apply switching unit 350 in a turning-off state. Then, the relay capacitor C5 is secondarily charged with the detection voltage of the anode terminal B charged to the floating capacitor C4. The voltage secondarily charged to the relay capacitor C5 has the same polarity as the voltage primarily charged to the floating capacitor C4. Thus, the voltage secondarily charged to the relay capacitor C5 has a positive voltage value. The voltage apply switching unit 350 keeps a turning-off state while the relay capacitor C5 is secondarily charged with the detection voltage of the anode terminal B, so it is possible to prevent the noise flowing from the battery 200 or the load L from being introduced to the leakage current determining unit 330. Subsequently, the switch controller 333 turns off the charge switching unit 340 and turns on the voltage apply switching unit 350 such that the detection voltage of the anode terminal B secondarily charged to the relay capacitor C5 is applied to the voltage measuring unit 320. Then, the voltage measuring unit 320 generates an analog voltage signal corresponding to the detection voltage of the anode terminal B and outputs the analog voltage signal to the A/D converter 331 of the leakage current determining unit 330. Then, the A/D converter 331 converts the analog voltage signal corresponding to the detection voltage of the anode terminal B into a digital voltage signal and outputs the digital voltage signal to the CPU 332. Accordingly, the CPU 332 obtains data relating to the detection voltage of the anode terminal B, which is necessary for calculating a leakage resistance. Because the charge switching unit 340 is in a turning-off state when the voltage measuring unit 320 measures the detection voltage of the anode terminal B charged to the relay capacitor C5, it is possible to prevent the noise from being introduced from the battery 200 or the load L to the leakage current determining unit 330.

The voltage measuring unit 320 may be realized using a differential amplifier. However, the relay capacitor C5 is always charged with a positive voltage, so the voltage measuring unit 320 may be realized with only one differential amplifier without comprising a polarity reverse circuit in the voltage measuring unit 320.

According to the present invention, the leakage current determining unit 330 may audibly or visually output a determining result whether a leakage current occurs or not. For this purpose, the leakage current determining unit 330 may further comprise a leakage current alarming unit 334.

In this case, if it is determined that a leakage current occurs, the leakage current determining unit 330 outputs a leakage current occurrence signal to the leakage current alarming unit 334. Then, the leakage current alarming unit 334 makes an audible or visual alarm to notify the occurrence of leakage current. The leakage current alarming unit 334 may be LED, LCD, an alarm device or their combinations. Thus, the leakage current alarming unit 334 makes an alarm about the occurrence of leakage current to a user by blinking LED, outputting an alarm message on an LCD or generating an alarming sound through an alarm device. However, it would be obvious that the present invention is not limited to the above but may be modified in various ways by adopting various kinds of visual or audible alarming devices as the leakage current alarming unit 334.

The battery leakage current sensing apparatus according to the present invention may be coupled to various kinds of battery driving apparatuses that receive power from a battery.

As one example, the leakage current sensing apparatus of the present invention may be comprised in various electronic products receiving a power from a battery, such as notebooks, mobile phones and personal portable multimedia regenerators.

As another example, the leakage current sensing apparatus of the present invention may be comprised in various power-driven apparatuses having a battery loaded therein, such as fossil fuel vehicles, electric vehicles, hybrid vehicles and electric bicycles.

Further, it would be apparent to those having ordinary skill in the art that the leakage current sensing apparatus of the present invention may be modulated into a PCB circuit or an on-demand semiconductor circuit (e.g., ASIC: Application-Specific Integrated Circuit) and then loaded in a battery pack.

Figure 4:
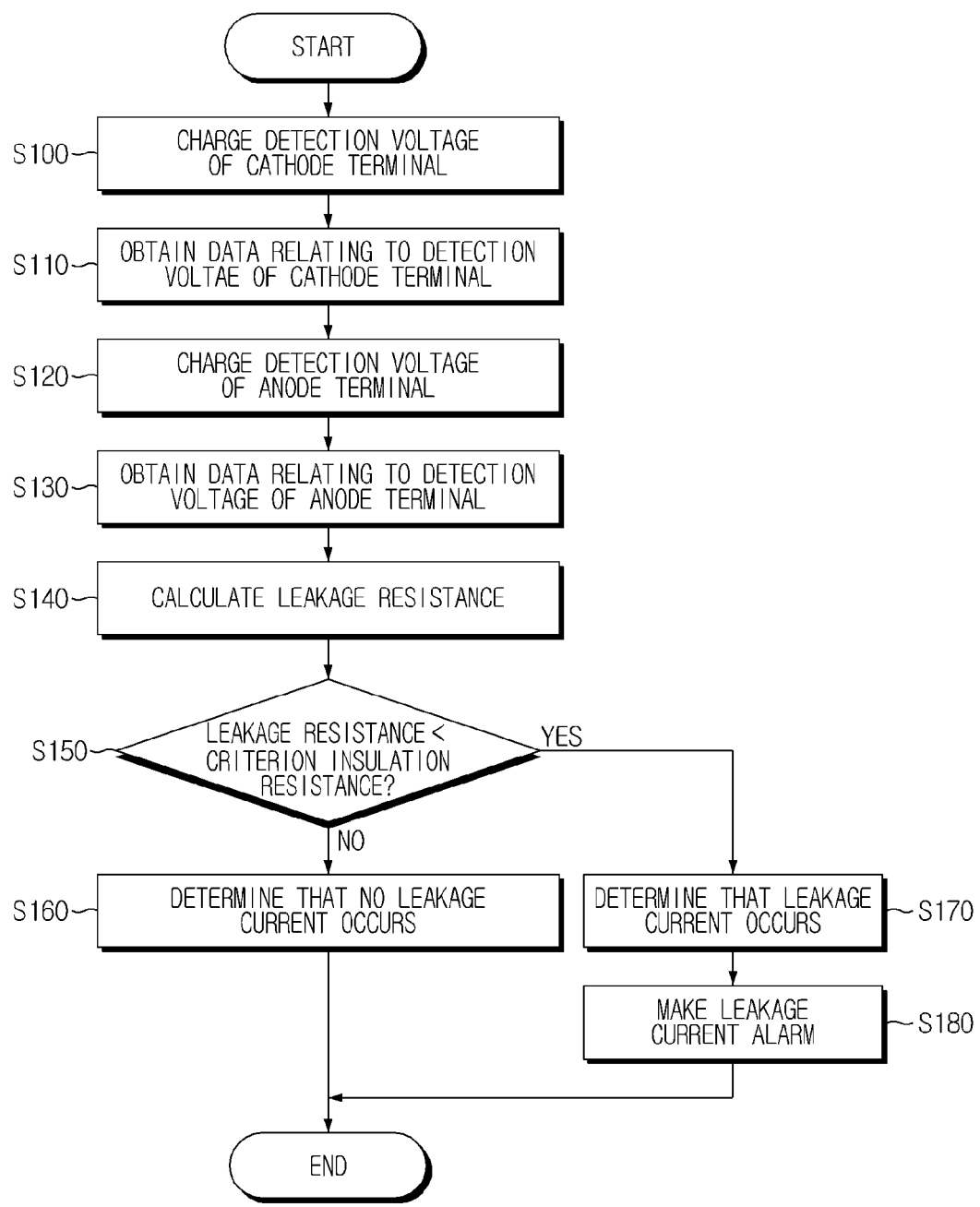
FIG. 4 is a flowchart illustrating a method for sensing a leakage current of a battery according to a first embodiment of the present invention.

FIG. 4 is a flowchart illustrating a method for sensing a leakage current of a battery according to a first embodiment of the present invention.

A method for sensing a leakage current of a battery according to the first embodiment of the present invention is explained below with reference to FIGS. 1 to 4.

First, in the step S100, the leakage current determining unit 330 turns on the cathode terminal selection switching unit SW1, SW2 and turns off the anode terminal selection switching unit SW3, SW4 to select a voltage detection path of the cathode terminal such that an electric current flows from the cathode terminal A to the second voltage distribution node n2 to charge the floating capacitor C4 with the detection voltage of the cathode terminal A. Then, the detection voltage of the cathode terminal A charged to the floating capacitor C4 is applied to the voltage measuring unit 320 through the second voltage distribution node n2, and as a response the voltage measuring unit 320 outputs an analog voltage signal corresponding to the detection voltage of the cathode terminal A to the leakage current determining unit 330.

Subsequently, in the step S110, the leakage current determining unit 330 receives an analog voltage signal corresponding to the detection voltage of the cathode terminal A output from the voltage measuring unit 320, and then converts the analog voltage signal into a digital voltage signal by using the A/D converter 331 to obtain data relating to the detection voltage of the cathode terminal A.

Then, in the step S120, the leakage current determining unit 330 turns on the anode terminal selection switching unit SW3, SW4 and turns off the cathode terminal selection switching unit SW1, SW2 to select a voltage detection path of the anode terminal such that an electric current flows from the DC voltage applying unit 310 to the anode terminal B to charge the floating capacitor C4 with the detection voltage of the anode terminal B. Then, the detection voltage of the anode terminal B charged to the floating capacitor C4 is applied to the voltage measuring unit 320 through the second voltage distribution node n2, and as a response the voltage measuring unit 320 outputs an analog voltage signal corresponding to the detection voltage of the anode terminal B to the leakage current determining unit 330.

Subsequently, in the step S130, the leakage current determining unit 330 receives the analog voltage signal corresponding to the detection voltage of the anode terminal B output from the voltage measuring unit 320, and then converts the analog voltage signal into a digital voltage signal by using the A/D converter 331 to obtain data relating to the detection voltage of the anode terminal B.

After that, in the step S140, the leakage current determining unit 330 calculates a leakage resistance based on the above equation 1 by using the detection voltages of the cathode terminal A and the anode terminal B, obtained in the steps S110 and S130.

And then, in the step S150, the leakage current determining unit 330 compares the leakage resistance calculated in the step S140 with a criterion insulation resistance and determines whether the calculated leakage current is smaller than the criterion insulation resistance.

The step S160 is executed when the leakage current calculated in the step S140 is greater than or equal to the criterion insulation resistance, and the leakage current determining unit 330 determines that a leakage current does not occur in the battery 200.

The step S170 is executed when the leakage current calculated in the step S140 is smaller than the criterion insulation resistance, and the leakage current determining unit 330 determines that a leakage current occurs in the battery 200.

Subsequently, in the step S180, since it is determined in the step S170 that a leakage current occurs, the leakage current determining unit 330 alarms the occurrence of leakage current visually or audibly through the leakage current alarming unit 334.

The steps S100 to S180 may be selectively executed in case it is required to sense a leakage current while the battery is in operation, or may be automatically repeated at regular intervals.

Meanwhile, as an alternative embodiment, the steps S140 and S150 may be modified as follows.

As an example, the leakage current determining unit 330 may determines the occurrence of leakage current by checking whether the detection voltage of the cathode terminal A or the anode terminal B departs from a preset safe voltage range. In this case, if the leakage current determining unit 330 determines that the detection voltage of the cathode terminal A or the anode terminal B departs from the preset safe voltage range, the step S170 is executed. On the contrary, if it is determined that the detection voltage of the cathode terminal A or the anode terminal B does not depart from the present safe voltage range, the step S160 may be executed.

As another example, the leakage current determining unit 330 may obtain a leakage resistance corresponding to the detection voltage of the cathode terminal A and the detection voltage of the anode terminal B with reference to the look-up table in which leakage resistances for detection voltages of the cathode terminal A and the anode terminal B under various conditions are previously defined, and then determine the occurrence of leakage current by comparing the obtained leakage resistance with a criterion insulation resistance. In this case, if the leakage resistance obtained from the look-up table is smaller than the criterion insulation resistance, the leakage current determining unit 330 executes the step S170. On the contrary, if the leakage resistance obtained from the look-up table is greater than or equal to the criterion insulation resistance, the step S160 may be executed.

Figure 5:
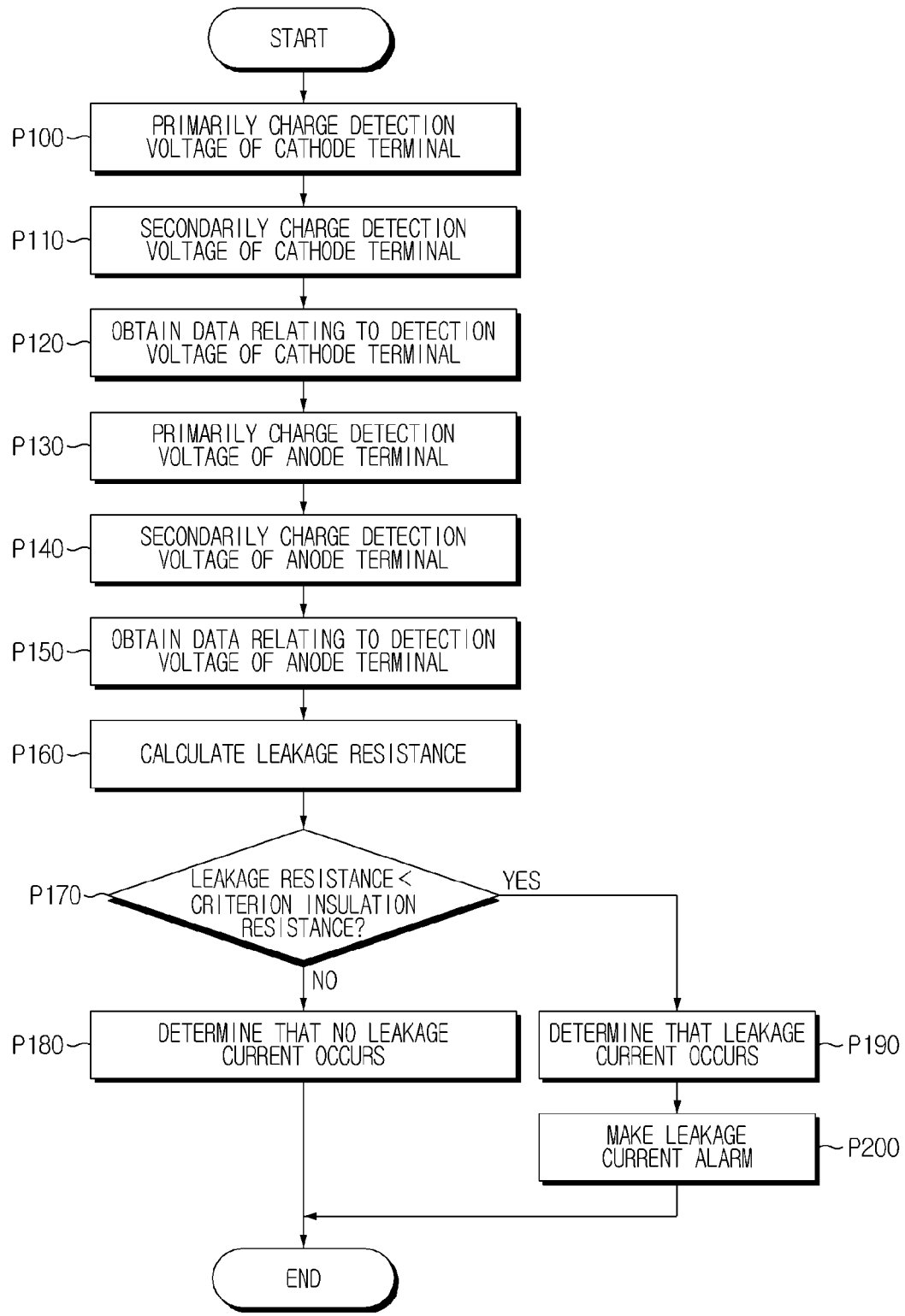
FIG. 5 is a flowchart illustrating a method for sensing a leakage current of a battery according to a second embodiment of the present invention.

FIG. 5 is a flowchart illustrating a method for sensing a leakage current of a battery according to a second embodiment of the present invention.

The method for sensing a leakage current of a battery according to the second embodiment is explained below with reference to FIGS. 2 and 5.

First, in the step P100, the leakage current determining unit 330 turns on the cathode terminal selection switching unit SW1, SW2 and turns off the anode terminal selection switching unit SW3, SW4 while keeping the charge switching unit 340 and the voltage apply switching unit 350 in a turning-off state, thereby selecting a voltage detection path of the cathode terminal B such that an electric current flows from the cathode terminal A to the second voltage distribution node n2 to primarily charge the floating capacitor C4 with the detection voltage of the cathode terminal A.

Subsequently, in the step P110, the leakage current determining unit 330 turns on the charge switching unit 340 and turns off the cathode terminal selection switching unit SW1, SW2 while keeping the voltage apply switching unit 350 and the anode terminal selection switching unit SW3, SW4 in a turning-off state such that the relay capacitor C5 is secondarily charged with the detection voltage of the cathode terminal A, primarily charged to the floating capacitor C4, through the second voltage distribution node n2.

After that, in the step P120, the leakage current determining unit 330 turns off the charge switching unit 340 and turns on the voltage apply switching unit 350 to apply the detection voltage of the cathode terminal A charged to the relay capacitor C5 to the voltage measuring unit 320. Then, the voltage measuring unit 320 outputs an analog voltage signal corresponding to the detection voltage of the cathode terminal A to the leakage current determining unit 330, and the leakage current determining unit 330 receives the analog voltage signal corresponding to the detection voltage of the cathode terminal A output from the voltage measuring unit 320 and then converts the analog voltage signal into a digital voltage signal by using the A/D converter 331 to obtain data relating to the detection voltage of the cathode terminal A.

Then, in the step P130, the leakage current determining unit 330 turns on the anode terminal selection switching unit SW3, SW4 and turns off the cathode terminal selection switching unit SW1, SW2 while keeping the charge switching unit 340 and the voltage apply switching unit 350 in a turning-off state, thereby selecting a voltage detection path of the anode terminal B such that an electric current flows from the DC voltage applying unit 310 to the anode terminal B to primarily charge the floating capacitor C4 with the detection voltage of the anode terminal B.

Subsequently, in the step P140, the leakage current determining unit 330 turns on the charge switching unit 340 and turns off the anode terminal selection switching unit SW3, SW4 while keeping the voltage apply switching unit 350 and the cathode terminal selection switching unit SW1, SW2 in a turning-off state such that the relay capacitor C5 is secondarily charged with the detection voltage of the anode terminal B, primarily charged to the floating capacitor C4, through the second voltage distribution node n2.

After that, in the step P150, the leakage current determining unit 330 turns off the charge switching unit 340 and turns on the voltage apply switching unit 350 to apply the detection voltage of the anode terminal B charged to the relay capacitor C5 to the voltage measuring unit 320. Then, the voltage measuring unit 320 outputs an analog voltage signal corresponding to the detection voltage of the anode terminal B to the leakage current determining unit 330, and the leakage current determining unit 330 receives the analog voltage signal corresponding to the detection voltage of the anode terminal B output from the voltage measuring unit 320 and then converts the analog voltage signal into a digital voltage signal by the A/D converter 331 to obtain data relating to the detection voltage of the anode terminal B.

And then, in the step P160, the leakage current determining unit 330 calculates a leakage resistance based on the above equation 1 by using the detection voltages of the cathode terminal A and the anode terminal B, obtained in the steps P120 and P150.

After that, in the step P170, the leakage current determining unit 330 compares the leakage resistance calculated in the step P160 with a criterion insulation resistance to determine whether the calculated leakage resistance is smaller than the criterion insulation resistance.

The step P180 is executed in case the leakage resistance calculated in the step P160 is greater than or equal to the criterion insulation resistance, and the leakage current determining unit 330 determines that a leakage current does not occur in the battery 200.

The step P190 is executed when the leakage current calculated in the step P160 is smaller than the criterion insulation resistance, and the leakage current determining unit 330 determines that a leakage current occurs in the battery 200.

Subsequently, in the step P200, since it is determined in the step P190 that a leakage current occurs, the leakage current determining unit 330 makes a visual or audible alarm through the leakage current alarming unit 334.

The steps P100 to P200 may be selectively executed when it is necessary to sense a leakage current while the battery is in operation, or may be automatically repeated at regular interval.

Meanwhile, in an alternative embodiment, the steps P160 and P170 may be modified as follows.

As an example, the leakage current determining unit 330 may determine the occurrence of leakage current by checking whether the detection voltage of the cathode terminal A or the anode terminal B departs from a present safe voltage range. In this case, if the leakage current determining unit 330 determines that the detection voltage of the cathode terminal A or the anode terminal B departs from the preset safe voltage range, the step P190 is executed. On the contrary, if it is determined that the detection voltage of the cathode terminal A or the anode terminal B does not depart from the present safe voltage range, the step P180 may be executed.

As another example, the leakage current determining unit 330 may obtain a leakage resistance corresponding to the detection voltage of the cathode terminal A and the detection voltage of the anode terminal B with reference to the look-up table in which leakage resistances for detection voltages of the cathode terminal A and the anode terminal B under various conditions are previously defined, and then determine the occurrence of leakage current by comparing the obtained leakage resistance with a criterion insulation resistance. In this case, if the leakage resistance obtained from the look-up table is smaller than the criterion insulation resistance, the leakage current determining unit 330 executes the step P190. On the contrary, if the leakage resistance obtained from the look-up table is greater than or equal to the criterion insulation resistance, the step P180 may be executed.

INDUSTRIAL APPLICABILITY

According to the present invention, a voltage variation of both terminals of a battery caused by a leakage current is sensed using a floating capacitor to determine whether a leakage current occurs, so it is possible to prevent the accuracy of leakage voltage determination from being deteriorated due to a noise introduced from a battery or a load. In addition, it is possible to sense the occurrence of a leakage current of a battery at an early stage and then prevent the battery from being fully discharged. Also, it is possible to take protective measures against malfunctions or breakdown of internal electrical devices of a vehicle, caused by a leakage current, and also to prevent injury of humans caused by a leakage current of a battery.

In another aspect of the present invention, the relay capacitor is secondarily charged with the voltage primarily charged to the floating capacitor, and the relay capacitor is electrically separated from the battery before sensing a voltage charged to the relay capacitor, so it is possible to decrease noise introduced from the battery or a load, which allows more accurate detection of a leakage current.

In still another aspect of the present invention, it is possible to sense all leakage currents occurring at the cathode and anode terminals of a battery.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An apparatus for sensing a leakage current of a battery, comprising:
 a floating capacitor charged with a voltage detected from a cathode terminal or an anode terminal of a battery;
 a cathode terminal selection switching unit for selecting a voltage detection path for the cathode terminal and charging the floating capacitor with a detection voltage of the cathode terminal;
 an anode terminal selection switching unit for selecting a voltage detection path for the anode terminal and charging the floating capacitor with a detection voltage of the anode terminal;
 a DC (Direct Current) voltage applying unit for applying a DC voltage through the selected voltage detection path for the anode terminal;
 a voltage measuring unit for measuring the detection voltage of the cathode terminal or the anode terminal, charged to the floating capacitor; and
 a leakage current determining unit for determining the occurrence of a leakage current based on the detection voltages of the cathode terminal and the anode terminal, measured by the voltage measuring unit.

2. The apparatus for sensing a leakage current of a battery according to claim 1, further comprising:
 a first line connecting the cathode terminal and the anode terminal of the battery;
 a first voltage distribution node located on the first line; and
 a second line diverged from the first voltage distribution node.

3. The apparatus for sensing a leakage current of a battery according to claim 2,
 wherein the cathode terminal selection switching unit comprises:
  a first switch installed between the first voltage distribution node and the cathode terminal of the battery; and
  a second switch installed on the second line.

4. The apparatus for sensing a leakage current of a battery according to claim 3,
 wherein, when the voltage detection path for the cathode terminal is selected, the first and second switches are turned on at the same time under the control of the leakage current determining unit.

5. The apparatus for sensing a leakage current of a battery according to claim 2,
 wherein the anode terminal selection switching unit comprises:
  a third switch installed between the first voltage distribution node and the anode terminal of the battery; and
  a fourth switch installed on a third line diverged from the second line.

6. The apparatus for sensing a leakage current of a battery according to claim 5,
 wherein, when the voltage detection path for the anode terminal is selected, the third and fourth switches are turned on at the same time under the control of the leakage current determining unit.

7. The apparatus for sensing a leakage current of a battery according to claim 2,
 wherein a second voltage distribution node is located on the second line, and
 wherein the floating capacitor is installed between the second voltage distribution node and the ground.

8. The apparatus for sensing a leakage current of a battery according to claim 1,
 wherein the DC voltage applying unit is installed between the anode terminal selection switching unit and the ground.

9. The apparatus for sensing a leakage current of a battery according to claim 1,
 wherein the voltage measuring unit is a voltage follower that outputs an analog voltage signal corresponding to a voltage level charged to the floating capacitor.

10. The apparatus for sensing a leakage current of a battery according to claim 1,
 wherein the detection voltage of the cathode terminal and the anode terminal, charged to the floating capacitor, have the same polarity.

11. The apparatus for sensing a leakage current of a battery according to claim 1, further comprising:
 a relay capacitor charged with the detection voltage of the cathode terminal or the anode terminal, charged to the floating capacitor;
 a charge switching unit for applying the voltage charged to the floating capacitor to the relay capacitor for relay charging; and
 a voltage apply switching unit for applying the detection voltage of the cathode terminal or the anode terminal, charged to the relay capacitor, to the voltage measuring unit.

12. The apparatus for sensing a leakage current of battery according to claim 11,
 wherein the charge switching unit is turned off before the voltage apply switching unit turns on under the control of the leakage current determining unit.

13. The apparatus for sensing a leakage current of a battery according to claim 11,
 wherein the voltage measuring unit is a differential amplifier that outputs an analog voltage signal corresponding to a difference of voltages at both terminals of the relay capacitor.

14. The apparatus for sensing a leakage current of a battery according to claim 11,
 wherein the detection voltages of the cathode terminal and the anode terminal, charged to the relay capacitor, have the same polarity.

15. The apparatus for sensing a leakage current of a battery according to claim 1,
 wherein the leakage current determining unit comprises:
  a switch controller for controlling operations of the cathode terminal selection switching unit and the anode terminal selection switching unit;
  an A/D (Analog/Digital) converter for converting an analog voltage signal corresponding to the detection voltages of the cathode terminal and the anode terminal, output from the voltage measuring unit, into a digital voltage signal; and
  a CPU (Central Processing Unit) for receiving the digital voltage signal from the A/D converter and determining the occurrence of a leakage current based on the detection voltages of the cathode terminal and the anode terminal.

16. The apparatus for sensing a leakage current of a battery according to claim 1, wherein the leakage current determining unit calculates a leakage resistance according to the following equation, and determines that a leakage current occurs in case the calculated leakage resistance is smaller than a criterion insulation resistance:

$$R_{leakage} = R_i \times \frac{(E - V_A + V_B)}{(V_A - V_B)}$$

where $R_i$ is an internal resistance of the apparatus, E is a voltage of both ends of the battery, $V_A$ is the detection voltage of the cathode terminal charged to the floating capacitor, and $V_B$ is the detection voltage of the anode terminal charged to the floating capacitor.

17. The apparatus for sensing a leakage current of a battery according to claim 1,
wherein the leakage current determining unit determines that a leakage current occurs in case the measured detection voltage of the cathode terminal or the anode terminal departs from a preset safe voltage range.

18. The apparatus for sensing a leakage current of a battery according to claim 1,
wherein the leakage current determining unit obtains a leakage resistance corresponding to the detection voltages of the cathode terminal and the anode terminal with reference to a look-up table in which leakage resistances are already defined for each detection voltage of the cathode terminal and the anode terminal under various conditions, and then determines that a leakage current occurs in case the obtained leakage resistance is smaller than a criterion insulation resistance.

19. The apparatus for sensing a leakage current of a battery according to claim 1,
wherein the leakage current determining unit further comprises a leakage current alarming unit for visually or audibly alarming the occurrence of a leakage current, and
wherein the leakage current alarming unit makes a visual or audible alarm in case a leakage current occurs.

20. A battery pack, which comprises the apparatus for sensing a leakage current of a battery as defined in claim 1.

21. A battery-driven apparatus, which comprises the apparatus for sensing a leakage current of a battery as defined in claim 1.

22. A method for sensing a leakage current of a battery, comprising:
(a) selecting a voltage detection path for a cathode terminal of a battery, charging a floating capacitor with a detection voltage of the cathode terminal of the battery, and then measuring the detection voltage of the cathode terminal;
(b) selecting a voltage detection path for an anode terminal of the battery, applying a DC voltage to the anode terminal of the battery to charge the floating capacitor with a detection voltage of the anode terminal of the battery, and then measuring the detection voltage of the anode terminal; and
(c) determining from the measured detection voltages of the cathode terminal and the anode terminal whether a leakage current occurs.

23. The method for sensing a leakage current of a battery according to claim 22,
wherein, in the step (c), a leakage resistance is calculated from the detection voltages of the cathode terminal and the anode terminal according to the following equation, and it is determined that a leakage current occurs in case the calculated leakage resistance is smaller than a criterion insulation resistance:

$$R_{leakage} = R_i \times \frac{(E - V_A + V_B)}{(V_A - V_B)}$$

where $R_i$ is an internal resistance of the apparatus, E is a voltage of both ends of the battery, $V_A$ is the detection voltage of the cathode terminal charged to the floating capacitor, and $V_B$ is the detection voltage of the anode terminal charged to the floating capacitor.

24. The method for sensing a leakage current of a battery according to claim 22,
wherein, in the step (c), it is determined that a leakage current occurs in case the measured detection voltage of the cathode terminal or the anode terminal departs from a preset safe voltage range.

25. The method for sensing a leakage current of a battery according to claim 22,
wherein the step (c) comprises:
obtaining a leakage resistance corresponding to the detection voltages of the cathode terminal and the anode terminal with reference to a look-up table in which leakage resistances are already defined for each detection voltage of the cathode terminal and the anode terminal under various conditions; and
determining that a leakage current occurs in case the obtained leakage resistance is smaller than a criterion insulation resistance.

26. The method for sensing a leakage current of a battery according to claim 22, further comprising:
making a visual or audible alarm in case it is determined that a leakage current occurs.

27. A method for sensing a leakage current of a battery, comprising:
(a) selecting a voltage detection path for a cathode terminal of a battery, primarily charging a floating capacitor with a detection voltage of the cathode terminal of the battery, and secondarily charging a relay capacitor with the charged detection voltage of the cathode terminal;
(b) measuring the detection voltage of the cathode terminal, secondarily charged to the relay capacitor, in a state that the relay capacitor is electrically separated from the battery;
(c) selecting a voltage detection path for an anode terminal of the battery, applying a DC voltage to the anode terminal of the battery to primarily charge the floating capacitor with a detection voltage of the anode terminal of the battery, and then secondarily charging a relay capacitor with the charged detection voltage of the anode terminal;
(d) measuring the detection voltage of the anode terminal, secondarily charged to the relay capacitor, in a state that the relay capacitor is electrically separated from the battery; and
(e) determining from the measured detection voltages of the cathode terminal and the anode terminal whether a leakage current occurs.

28. The method for sensing a leakage current of a battery according to claim 27,
wherein, in the step (e), a leakage resistance is calculated from the detection voltages of the cathode terminal and the anode terminal according to the following equation, and it is determined that a leakage current occurs in case the calculated leakage resistance is smaller than a criterion insulation resistance:

$$R_{leakage} = R_i \times \frac{(E - V_A + V_B)}{(V_A - V_B)}$$

where $R_i$ is an internal resistance of the apparatus, E is a voltage of both ends of the battery, $V_A$ is the detection voltage of the cathode terminal charged to the floating capacitor, and $V_B$ is the detection voltage of the anode terminal charged to the floating capacitor.

29. The method for sensing a leakage current of a battery according to claim 27,
wherein, in the step (e), it is determined that a leakage current occurs in case the measured detection voltage of the cathode terminal or the anode terminal departs from a preset safe voltage range.

30. The method for sensing a leakage current of a battery according to claim 27,
wherein the step (e) comprises:
obtaining a leakage resistance corresponding to the detection voltages of the cathode terminal and the anode terminal with reference to a look-up table in which leakage resistances are already defined for each detection voltage of the cathode terminal and the anode terminal under various conditions; and
determining that a leakage current occurs in case the obtained leakage resistance is smaller than a criterion insulation resistance.

31. The method for sensing a leakage current of a battery according to claim 27, further comprising:
making a visual or audible alarm in case it is determined that a leakage current occurs.

* * * * *